(12) United States Patent
Chu et al.

(10) Patent No.: US 6,174,591 B1
(45) Date of Patent: Jan. 16, 2001

(54) SEPARATORS WITH DIRECT HEATING MEDIUM AND METHOD FOR MANUFACTURING THERMALLY CURABLE LAMINATES THEREOF

(75) Inventors: Myung Chul Chu, Palisade Park, NJ (US); Chang Kyu Choi, Seoul (KR)

(73) Assignees: Anico Industrial Corporation, Seoul (KR); CSS International Corporation, Palisade Park, NJ (US)

(*) Notice: Under 35 U.S.C. 154(b), the term of this patent shall be extended for 0 days.

(21) Appl. No.: 09/302,028

(22) Filed: Apr. 29, 1999

(30) Foreign Application Priority Data

Apr. 30, 1998 (KR) .................................. P98-15470

(51) Int. Cl.[7] ...................................... B32B 3/00
(52) U.S. Cl. ...................... 428/209; 428/901; 174/254; 174/255
(58) Field of Search ...................... 428/209, 901; 174/250, 254, 255

(56) References Cited

U.S. PATENT DOCUMENTS 5,615,470  4/1997  Ceraso ................. 29/469.5
5,647,940  7/1997  Ceraso ................. 156/273.9

FOREIGN PATENT DOCUMENTS

WO 93/22139  11/1993  (WO) .

*Primary Examiner*—Cathy Lam
(74) *Attorney, Agent, or Firm*—Christie, Parker & Hale, LLP

(57) ABSTRACT

Separators with direct heating medium and method for manufacturing thermally curable laminates thereof. Metal separators used in a book to separate board from board after lamination are engineered to incorporate a thin metal layer or multiple circuits as an electrical heating medium. The electrically heatable separators can then heat the boards directly in contact with individual boards, so that the temperature differences among the boards in a book as well as in an individual board are minimized. This reduction of the difference in temperature minimizes the characteristic difference in chemorheology of the thermally curable bonding sheets. Laminates manufactured by this process exhibit low levels of variation in physical properties, making it suitable for printed circuit board of high density integration.

6 Claims, 2 Drawing Sheets

SEPARATORS WITH DIRECT HEATING MEDIUM AND METHOD FOR MANUFACTURING THERMALLY CURABLE LAMINATES THEREOF

BACKGROUND OF THE INVENTION

The present invention relates to a separator that heats each board in a book through direct contact between the separator and the board for the manufacture of metal clad laminates, unclad laminates, and multilayer printed circuit boards (hereinafter referred to as PCB).

The electronic packaging industry is experiencing rapid changes in manufacturing technology, moving toward ever higher density and performance circuits. 100 $\mu$m and narrower circuit traces are common nowadays, and demand for 50 $\mu$m circuit traces is increasing. Similarly, the hole population is ever increasing, and in some applications, such as land grid array in a first level chip packaging, it amounts to several tens per $cm^2$ board. In order to accommodate such a demand, the size of a land is shrinking, which in turn necessitates a higher degree of dimensional stability in the metal clad laminate or pressed multilayer PCB. Otherwise, the failure rate of the registration of a drilled hole on the land will also increase. Therefore, the variation in dimensional movement of a metal clad laminate or pressed multilayer PCB needs to be minimized to improve the production yield and quality of the processed board. Also, a printed circuit board, such as memory module or high level of impedance control board, requires a very narrow level of thickness tolerance. Therefore, the industry needs a technology that can produce highly uniform laminates or pressed multilayer PCB.

In order to have thermally curable prepregs cured to laminates with high uniformity, the conditions of the curing should result in each prepreg having a similar chemorheological history regardless of its position in the press daylight. The chemorheology of a thermosetting prepreg is affected by three factors: temperature, time, and reaction kinetics. The prepregs in a book can be assumed to be the same. Therefore, the only factor that causes differences between prepregs in a book is temperature during heating cycle. Thus, to make the chemorheologies of the prepregs more identical to each other, the heating of each prepreg should be as similar as possible.

Conventional technology accommodates about 10 boards per book. Each board contains prepregs, metal foils, and innerlayer PCB if multilayer PCB is to be made; and each board is sandwiched between metal separators. Thereafter, the book is loaded into the press daylight, and heated through the platens located at the top and the bottom of the book. Because of this heating mechanism, the thermal history of each board varies according to the location of the board in the book. It is quite common for the temperature difference among the boards to be as high as 15° C. during the heating cycle and for the difference from position to position on a board to range from 3 to 10° C. Therefore, the prepregs undergo different paths of chemorheology, depending upon their location in the book. This results in large variations in the physical qualities of the pressed boards, the so called laminates, a fact well known to those conversant with the PCB industry.

To circumvent the intrinsic problem of the conventional technology, PCT/IT 92/00101, U.S. Pat. No. 5615470 and U.S. Pat. No. 5647940 were disclosed in the early 1990's, and are incorporated herein for reference. These patents utilize metal foil, which is to be clad to the insulating material. The metal foil is continuously wrapped around the insulating material and the boards are separated by insulating separators. The metal foil is connected to electricity to heat the boards through induction. By this means, each of the boards in a book receives the same amount of heat and the temperature difference among the boards is less than 5° C. in most cases. However, the temperature difference on individual boards from position to position is quite often as high as 10° C. In the PCB industry, electrodeposited copper foil is most widely used, and the thickness tolerance is ±10% in most cases. This is one of the causes of the high level of temperature differences on a board. Experts within the PCB industry know that no real improvement is made by this technology in achieving a higher level dimensional stability.

Furthermore, because prepregs are built up with metal foil through continuous wrapping, the possibility of creating a surface imperfection is higher in comparison to the conventional technology in which the build up procedure can be divided into several areas, minimizing the dusty air flow of the prepregs onto the surfaces of the metal foil and separator.

In addition, the PCB shop is required to have a matching set of separators for each that match each panel size to minimize the loss in the metal foil; this means a higher investment in separators. The disadvantages of the metal foil technology can be summarized as follows:

1. It is possible to produce only metal clad laminates. No other laminates can be produced.
2. Most prepregs for industrial use are made of glass fabric, and glass fabric prepregs are better handled in a separate room to minimize the surface contamination of the metal foil and the separator. However, there are no other means than to handle the prepregs with the metal foil and separator in the same room and on the same table.
3. It is mandatory to have as many sets of separators as the number of working sizes of the panel. Otherwise, metal foil loss is higher than that in conventional technology.
4. Alignment of intermediate multilayer PCB are done through riveting, but alignment accuracy decreases as the number of layers increases.
5. As the heating source is the metal foil of which the thickness tolerance is +10%, resulting in a temperature variation on an individual board that can be greater than that with conventional technology.
6. A cooling press is required so that the book can be transferred to it after lamination. Otherwise, the cooling takes too long, resulting in poor productivity. But a cooling press induces thermal stress because of the temperature difference on a board from the center to the side. The thermal stress will worsen the dimensional stability of the laminate.

It is known that the physical properties of a laminate can be made consistent if each board in a stack of a book is heated equally. However, the thermal history of each board in a conventional press system differs from board to board in a book. In a recent development, metal foil is used to heat the board directly, achieving a large improvement in the temperature uniformity among boards. However, the temperature difference on an individual board from position to position is worse in most cases than that of the conventional hot press technology where heating is achieved through platens at the top and the bottom.

SUMMARY OF THE INVENTION

It is an object of the present invention to provide a separator that individually heats each of the boards stacked in a book.

It is another object of the present invention to provide a method of manufacturing a laminate utilizing the separator.

In order to achieve the above objects, the present invention provides another function to the current metal separator: directly heating the individual boards through the separators. A heating layer of which the thickness tolerance is within ±5% is formed. Thus, separators can heat the boards directly and the temperature differences among the boards and on each board are minimized. As a result of the reduction in temperature difference, the chemorheological properties of the prepregs on a board and among boards are almost identical during the heating cycle. After high temperature cure, the book is cooled through the platens at the top and the bottom of the book. The laminates produced in this manner exhibit excellent consistency in quality. Moreover, the same build up procedure as that used in a conventional hot press system can be maintained.

BRIEF DESCRIPTION OF THE DRAWINGS

The above objects, other features and advantages of the present invention will become more apparent by the preferred embodiments described with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

The term 'separator' in this invention describes a plate placed between boards used to ease the separation of the board after lamination and also to make the surface of the laminate smooth and flat. Stainless steel or aluminum plate of 1.2~2.5 mm thicknesses are commonly used for this purpose.

'Prepreg' denotes a thermosetting resin impregnated in a reinforcing medium and cured to a certain degree so that it is in dry sheet shape for easy handling. 'Board' denotes a stack of materials to be laminated. It is comprised of prepregs with or without materials to be bonded together. Examples of materials to be bonded together are metal foil and innerlayer printed circuit board. 'Lamination' denotes a process of loading the stacks of boards in a press daylight and heating the boards under pressure to a predetermined temperature to consolidate the boards into laminates.

Various media can be used as the heating layer in this invention. Conductive polymer, thin metal layer, and multiple circuits are three media exemplified in the present invention. The heating medium of the present invention is not limited to those examples but can be extended to any medium that can heat the separator electrically. However, if an electrodeposited metal foil such as electrodeposited copper foil is used, the heat supplied to the board can have a variance of as much as ±10% because a thickness tolerance of ±10% in the electrodeposited copper foil is quite common and acceptable in the PCB industry. Therefore, the thickness tolerance of the thin conductive layer of heating medium should be minimized to maximize the temperature uniformity on each board during lamination. For this purpose, the present invention uses rolled and annealed foil, of which the thickness tolerance is within ±3% when a metal foil is laminated as part of a separator. When the heating layer is formed through plating or vacuum deposition, the formed layer is ground to within ±5%. Conductive particles such as silver and carbon are mixed to a thermoset polymeric matrix and used as another source of heating medium. The conventional cooling process after cure is also used as it is commonly used without modification.

Details of the claimed invention will be described through references to FIGS. 1 through 4. The Figures are provided to explain the categories of the invention schematically. However it is to be noted that the structures in these Figures are only examples and that the scope of the invention is not limited to them.

Figure 1:
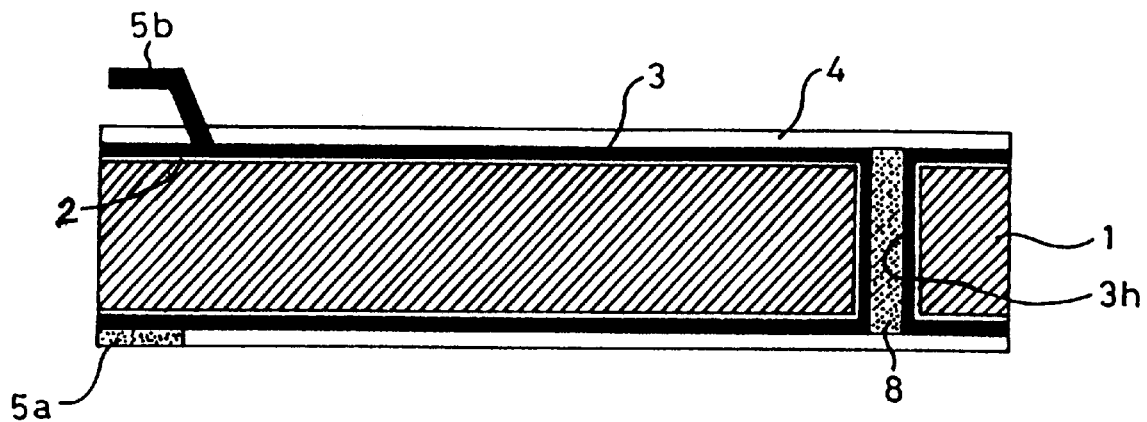
FIG. 1 is a sectional view of a separator wherein a metal core is used as a carrier according to a first embodiment of the present invention.

FIG. 1 depicts the first type of embodiment of the invention wherein a metal core is used as a carrier. 1 in the Figure denotes the metal core used as a carrier. Layer 2 is formed on the carrier (1) to serve as an insulating layer, and layer 3 is formed thereon to act as a heating layer. 3$h$ is a plated through hole to interconnect the top and bottom heating layers of the carrier (1). 8 depicts a thermoset polymer filled in the plated through hole (3$h$) and cured therein. Layer 4 is formed thereafter to provide an insulating layer. 5$a$ and 5$b$ are electrically separated from the carrier (1) and provide electrical contacts. Each pair of the electrical contacts (5$a$ and 5$b$) is connected either in parallel or in series to supply electrical energy to the heating layer (3). The heating layer (3) can be a conductive material such as copper or aluminum. The typical thickness of the heating layer (3) is 5~35 $\mu$m for copper and 15~70 $\mu$m for aluminum.

Figure 2:
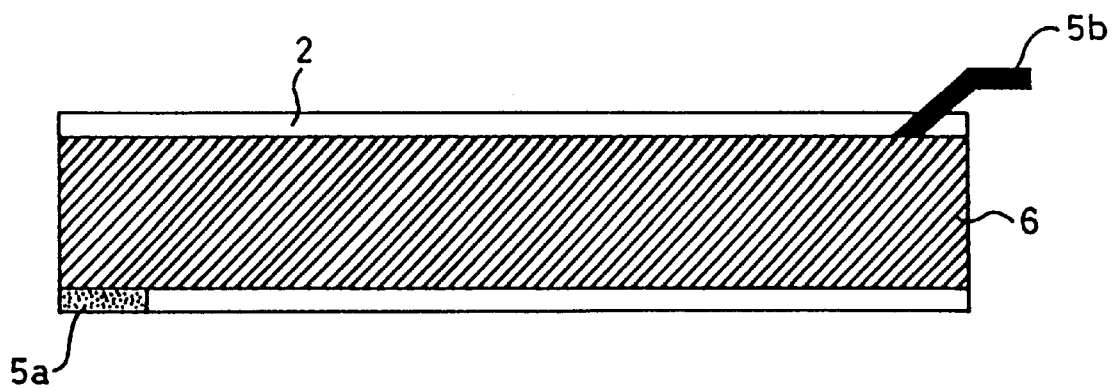
FIG. 2 is a sectional view of a separator wherein conductive polymer is used as a heating layer and a carrier according to a second embodiment of the present invention.

FIG. 2 depicts the second type of embodiment of the invention wherein conductive polymer is used as a heating layer and a carrier. 6 in the Figure is a composite material that is comprised of a thermoset polymer, quartz or glass fiber, and conductive particles that are 35~75% by weight. 2 is the insulating layer formed thereon, and 5$a$ and 5$b$ are the contacts to connect the heating layer (6) with electricity.

Figure 3:
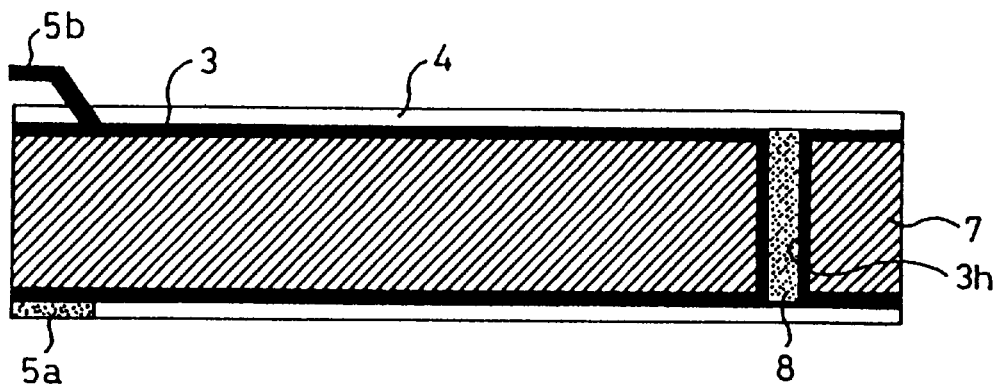
FIG. 3 is a sectional view of a separator wherein nonconductive polymer is used as a carrier according to a third embodiment of the present invention.

FIG. 3 depicts the third type of embodiment of the invention wherein nonconductive polymer is used as a carrier. 7 is a composite material that is comprised of nonconductive polymer and quartz or glass fiber. 3 is the heating layer in a thin metal form, 4 is the insulating layer, and 5$a$ and 5$b$ are the electrical contacts to the heating layer (3).

Figure 4:
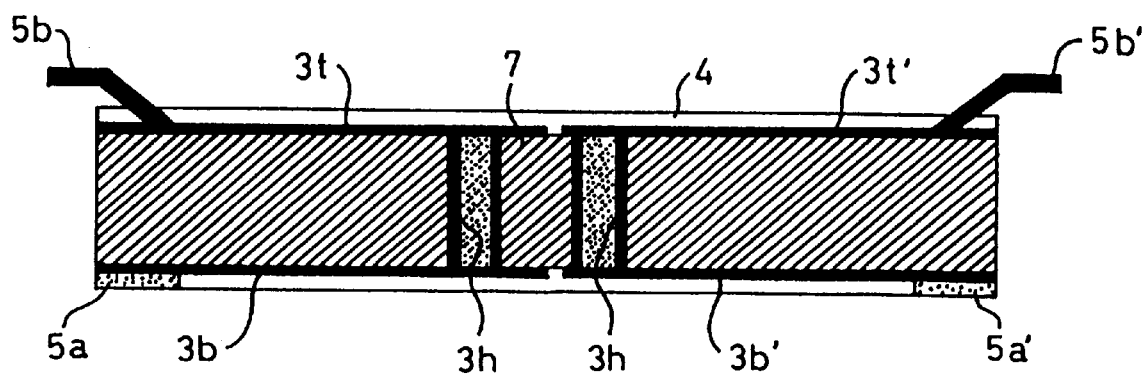
FIG. 4 is a sectional view of a separator wherein multiple heating circuits are used according to a fourth embodiment of the present invention.

FIG. 4 depicts the fourth type of embodiment of the invention wherein a multiple number of heating circuits is used. The Figure illustrates a specific case wherein two heating circuits are utilized to heat the separator independently. 7 is the carrier made from nonconductive composite, 3$b$, 3$b'$, 3$t$, and 3$t'$ are the heating circuits, and 4 is the insulating layer. 5$a$, 5$b$ and 5$a'$, 5$b'$ are the independent pairs of electrical contacts. 5$a$⇒3$b$⇒3$h$⇒3$t$⇒5$b$ and 5$a'$⇒3$b'$⇒3$h'$⇒3$t'$⇒5$b'$ are electrically connected respectively, and controlled independently. The Figure exemplifies a case of two independent circuits. However, it is to be noted that the present invention can be extended to a higher number of heating circuits.

It is the purpose of the multiple heating circuits to heat a board uniformly from position to position. A set of thermocouples is inserted between the top surface of the top separator and the cushion pad to control the temperatures. But the method of the control is not the immediate concern or object of the present invention and the scope of the present invention is not to be limited to the example above. An engineer in this art can easily devise a variety of temperature control techniques to monitor the positional temperatures.

EXAMPLES

Example 1

Fabrication of a Separator with the Thin Metal Layer

This example is shown in FIG. 1. An aluminum plate of 1.2 mm thickness is used as the metal carrier 1. The process entails the following 5 steps:

Step 1: Hole formation and cleaning

Holes of 1.0 mm diameter are drilled near the edge of one of the four sides of the metal carrier 1. The drilled holes are dipped in an alkaline solution at 60° C., followed by a thorough wash with deionized water.

Step 2: Formation of insulation layer 2

The metal carrier (1) is dipped in a 20° C. solution containing oxalic acid of 20~30 g/l and anodized at 1~3 A/dm$^2$ to form a 5~30 μm thick insulation layer on the surface and in the holes.

Step 3: Formation of heating layer 3

The plate is dipped in a weak alkaline solution at 60° C. and washed thoroughly. Activated palladium coat is formed in the holes and on the surface in an acidic palladium and tin solution. An accelerator is used to remove colloidal tin therefrom, and plated electrolessly to 0.2~1.5 μm thickness in a solution containing 2~3 grams of copper, 3~6 grams of formaldehyde, and 6~10 grams of sodium hydroxide per liter. 15~30 μm thick copper is plated on the electroless copper in an acidic electroplating solution containing 70 grams of copper sulfate, 200 grams of sulfuric acid, 6cc of LP-1 of Blasberg, Germany, and 0.1 grams of sodium chloride per liter. 5~10 μm of the plated copper is ground by a sand belt grinder to form heating layers (3). The voids in the plated holes are plugged with EL-18B of Alpha Metals located in California, U.S.A., and cured at 160° C. in an oven for 30 minutes.

Step 4: Formation of insulation layer 4.

The surface of the heating layer (3) is washed in a weak alkaline solution and plating protection tape is adhered to the area whereon electrical contact 5a is to be formed. Electrical contact of a spring type of beryllium-copper alloy (5b) is fastened mechanically onto the surface of the heating layer (3) and plating protection film is taped on it. Thereafter, the surface of the heating layer (3) is micro etched and washed thoroughly. Aluminum is vapor deposited thereon to a thickness of 15~30 μm, and is anodized as in step 2 to form an insulation layer (4). Step 5: Formation of electrical contact 5a.

The plating protection film taped on for electrical contact 5a is removed and the tape residue is dissolved away in hexane solution. The acidic plating solution in step 3 is used to plate copper thereon to 15~30 μm thickness. The plated copper is ground to be level with the insulation layer (4). 3~10 μm of copper is microetched therefrom in 10% each of sulfuric acid and hydrogen peroxide solution. Nickel sulfamate is used to plate 3~10 μm thick nickel on the copper and ground to be level with the height of the insulation layer (4). Gold is deposited thereon to 0.05~0.2 μm thickness to form electrical contact 5a in a plating solution containing 800~1200 ppm of cobalt and 5~25 gram of gold per liter. The plating protection tape on electrical contact 5b is removed and dipped in hexane to remove the tape residue. The plate is thoroughly washed and dried.

Test:

The separators made by the method described in example 1 were used to laminate boards, each of which contained 5 sheets of 7628 epoxy prepregs. 11 boards were stacked for a daylight load. The separators were electrically connected in series, and 0 to 500 amperes at 10 volts were charged to heat the boards to 170° C. at an average rate of increase of 3° C. /minute. The temperature differences among boards and on an individual board were measured and are shown in table 1 along with typical values achieved through conventional technologies.

TABLE 1

| Heating medium ° C. | Platen | Metal foil | Example 1 |
| --- | --- | --- | --- |
| Among Boards | Above 15° C. | Below 5° C. | 2~4° C. |
| On Individual Board | Below 5° C. | 8~10° C. | 3~5° C. |

The comparison shows that the present example is superior to the platen heating technology and equal or slightly better than the metal foil heating technology in temperature uniformity among boards. As for temperature uniformity on an individual board, the metal foil heating technology is worst and the platen heating and example 1 are in the same range.

Example 2

Fabrication of a Separator Using SUS 304

In place of the aluminum plate in example 1, SUS 304 is used. The same step 1 as in example 1 is applied and a 15~30 μm thick aluminum layer is formed on the metal carrier (1) through vacuum deposition. The insulation layer (2) is formed thereon as in step 2 in example 1. Steps 3 to 5 as in example 1 are followed to fabricate the captioned separator.

Test:

The same test method as in example 1 was used. The temperature difference among boards was 3~5° C. and on an individual board was 3~5° C.

Example 3

Fabrication of a Separator in Which Conductive Polymer is Used as a Heating Medium.

This example is shown in FIG. 2. A varnish (components listed in Table 2) is formulated.

TABLE 2

| | |
| --- | --- |
| LER-850 (Epoxy resin made by LG Chemical, Korea) | 100 |
| YDCN (Cresol novolak made by Kukdo Chemical, Korea) | 120 |
| Silver flake (1~10 μm) | 120~180 |
| Maleic anhydride | 35~55 |
| 2-pyromellic anhydride | 20~50 |
| Dimethylformaldehyde | 60~150 |

Glass mat of 210 g/m$^2$ and 1080 glass fabric is used to produce prepregs from the varnish above. 4 sheets of the glass mat prepregs are sandwiched with 1080 glass fabric prepregs. 18 μm thick rolled annealed aluminum foil is laid on the top and the bottom of the prepreg stack and heated to 180° C. under 3~100 kg$_f$/cm$^2$. The stack is cured for 40~120 minutes to yield an aluminum clad composite (6). Aluminum in the areas whereon electrical contacts 5a and 5b are to be formed are etched and plating protection tape is adhered thereon. Steps 4 and 5 as in example 1 are followed to form electrical contacts 5a and 5b.

Test:

The test method described in example 1 was repeated. The temperature difference among boards was 2~4° C. and on an individual board was 3~6° C.

Example 4

Fabrication of a Separator Containing non-conductive Polymeric Carrier.

This example is shown in FIG. 3. A 1.5 mm thick Teflon composite laminate, whose top and bottom surfaces are clad with half ounce copper foils, was purchased and used as the non-conductive polymeric carrier 7. Holes of 1.0 mm diameter are drilled at 2 mm intervals on one of the sides close to the edge.

The holes are cleaned with water under high pressure and electroplated as detailed in example 1. The plated copper surface is ground to 25 µm thickness and washed thoroughly. The voids in the plated holes are plugged as in step 3 in example 1. The surface is microetched in 10% each of sulfuric acid and hydrogen peroxide solution. Steps 4 and 5 as in example 1 are followed to fabricate the captioned separator.

Test:

The test method used in example 1 was applied. The temperature difference among boards was 3~6° C. and on an individual board was 2~5° C.

Example 5

Fabrication of a Separator which Contains Multiple Numbers of Heating Circuits.

This example is shown in FIG. 4. The Teflon composite laminate used in example 4 is used as a carrier (7). A series of holes of 1.0 mm diameter are drilled at 2.0 mm intervals on one of the sides close to the edge. The holes are cleaned with water of high pressure and electrodeposited as detailed in step 3 in example 1. The plated surface is ground to 25 µm and the holes are plugged with the thermosetting polymer as detailed in step 3 in example 1. The copper surface is micro etched in 10% each of sulfuric acid and hydrogen peroxide solution. Dry film photoresist is laminated thereon and a multiple number of heating circuits are imaged and developed in 1% potassium carbonate solution. Cupric chloride etchant is used to yield heating circuits of (3$t$, 3$b$) and (3$t$ ', 3$b$'). Photoresist is stripped in 10% caustic solution and washed thoroughly. The surfaces of the heating circuits are cleaned in alkaline solution and washed. The areas whereon electrical contacts 5$a$ and 5$a$' are to be formed are taped with plating protection film. Beryllium/copper alloy is mechanically fastened to form 5$b$ and 5$b$'. The surface of the heating circuits are micro etched in 10% each of sulfuric acid and hydrogen peroxide solution. 15~35 µm thick aluminum is vacuum deposited on both surfaces of the plate. The plating protection films are replaced with new tape and the aluminum layer is anodized to form an insulation layer (4) as in step 2 in example 1. The plating protection film taped on the areas whereon electrical contacts 5a and 5$a$' are to be formed are removed and the residue is brushed off in hexane. Copper is deposited to 15~30 µm thickness thereon in acid plating solution as detailed in example 1. The plated copper is ground to be level with the insulation layer 4. 3~10 µm of copper is etched therefrom in 10% each of sulfuric acid and hydrogen peroxide, and 3~10 µm of nickel is plated in nickel sulfamate solution. 0.05~0.2 µm of gold is deposited thereon to form electrical contacts 5$a$ and 5$a$'. The plating protection tapes on the electrical contacts 5$b$ and 5$b$' are removed and the residue is dissolved and brushed off in hexane. The set is thoroughly washed and dried.

Test:

The performance test described in example 1 was repeated. The temperature difference among boards was 3~6° C. and on an individual board was 2~4° C.

As described above, the present invention presents various embodiments of directly heating separators by means of electrical heating layers consisting of such media as a thin metal layer, conductive polymeric composite, and multiple independent heating circuits. Each one of the directly heating separators heats the board through direct contact with the boards. As a result, the thermal histories of the boards are almost identical, and the temperature differences among boards and on an individual board are minimized. The reduced difference in the thermal histories further results in minimized characteristic difference in chemorheololgy of the prepregs in the boards. Therefore, fabrication of laminates with much greater uniform thickness and dimensional stability is made possible.

The directly heating separator utilizes the advantage of metal foil banding technology, in which each board is directly in contact with the heating source. At the same time, the present invention also utilizes the advantages of the conventional hot press technology. First, the boards can be laid up in a way that minimizes surface imperfection through minimizing the dust deposition on the metal foil or separator. Second, the pressed boards can be cooled through the platens at the top and the bottom, minimizing the thermal stress due to temperature differences on an individual board.

Various directly heating separators have been described. The descriptions are intended to be illustrative, and not limitative. Thus, it will be apparent to anyone possessing ordinary skill in the art of fabricating laminates that certain modifications can be made to the invention as described without departing from the scope of the claims.

We claim:

1. A separator for placement between boards in a book to ease the separation of the boards after lamination in a board-press process of fabricating laminates by heating and pressing the boards, the separator comprising:

a carrier for supporting an adjacent board;

a first insulating layer covering the carrier;

an electrical heating element covering the first insulating layer for directly heating the board by electricity incoming through a plurality of electrical contacts, and said plurality of electrical contacts formed on the proper place of the electrical heating layer for connecting electrically to an electrical source of the outside and other separator; and a second insulating layer covering the electrical heating layer.

2. The separator as claimed in claim 1 wherein the carrier is composed of at least one of a metal, a polymeric composite containing conductive material, and a polymeric composite containing nonconductive material.

3. The separator as claimed in claim 1, wherein the electrical heating layer comprises a multiple number of heating circuits to heat a board substantially uniformly from position to position in the individual board.

4. A separator for placement between boards in a book to ease the separation of the boards after lamination in a board-press process of fabricating laminates by heating and pressing the boards, the separator comprising:

an electrical heating element adapted to heat the board by electricity incoming through a plurality of electrical contacts; and an insulating layer covering the electrical heating layer to prevent contact between the boards and the heating element.

5. The separator as claimed in claim 4, further including a carrier that is composed of at least one of a metal, a polymeric composite containing conductive material, and a polymeric composite containing nonconductive material.

6. The separator as claimed in claim 4, wherein the electrical heating layer comprises a multiple number of heating circuits to heat a board substantially uniformly from position to position in the individual board.

\* \* \* \* \*